US006876037B2

(12) United States Patent
Wei et al.

(10) Patent No.: US 6,876,037 B2
(45) Date of Patent: Apr. 5, 2005

(54) FULLY-DEPLETED SOI DEVICE

(75) Inventors: Andy C. Wei, Radebeul/Dresden (DE); Derick J. Wristers, Bee Caves, TX (US); Mark B. Fuselier, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/796,731

(22) Filed: Mar. 9, 2004

(65) Prior Publication Data

US 2004/0169227 A1 Sep. 2, 2004

Related U.S. Application Data

(62) Division of application No. 10/104,319, filed on Mar. 21, 2002, now Pat. No. 6,780,686.

(51) Int. Cl.[7] .............................................. H01L 27/01
(52) U.S. Cl. ........................ 257/347; 257/344; 257/408
(58) Field of Search .......................... 257/66, 173, 328, 257/336, 339, 344, 347, 355, 356, 367, 408

(56) References Cited

U.S. PATENT DOCUMENTS

| 4,697,198 A | * | 9/1987 | Komori et al. ............. 257/345 |
| 4,784,968 A | * | 11/1988 | Komori et al. ............. 438/291 |
| 4,961,165 A | * | 10/1990 | Ema ........................... 365/182 |
| 5,413,949 A | * | 5/1995 | Hong ......................... 438/290 |
| 5,482,871 A | | 1/1996 | Pollack ...................... 438/151 |
| 5,599,728 A | * | 2/1997 | Hu et al. .................... 438/289 |
| 5,926,703 A | | 7/1999 | Yamaguchi et al. ........ 438/163 |
| 6,221,724 B1 | * | 4/2001 | Yu et al. ..................... 438/289 |
| 6,232,163 B1 | | 5/2001 | Voldman et al. ............ 438/212 |
| 6,352,882 B1 | | 3/2002 | Assaderaghi et al. ....... 438/155 |
| 6,407,428 B1 | | 6/2002 | Krishnan et al. ........... 257/347 |
| 6,468,852 B1 | * | 10/2002 | Gonzalez et al. ........... 438/217 |

OTHER PUBLICATIONS

Baine et al., "Back Gate Effects in N–Channel Monocrystalline Silicon Devices–on–Glass and Their Suppression by Boron Ion Implantation," *Mat. Res. Soc. Symp. Proc.*, 558:369–74, 2000.

Chang et al., "Efficacy of Air in Reducing the Kink Effect on Floating–Body NFD/SOI CMOS," *Proc. 1998 IEEE Int'l SOI Conf.*, pp. 155–156, 1998.

Ko et al., "Suppression of Floating Body Effect with SIGE Source Structure for Fully Depleted SOI MOSFET's," *Electrochem. Soc. Proc.*, 2001–3:239–44, 2001.

Leung et al., "High voltage, high speed lateral IGBT in thin SOI for power IC," *SOI 1996 Int'l Conference Proceedings*, pp. 132–133, 1996.

* cited by examiner

*Primary Examiner*—John F. Niebling
*Assistant Examiner*—Stanetta Isaac
(74) *Attorney, Agent, or Firm*—Williams, Morgan & Amerson, P.C.

(57) ABSTRACT

The present invention is generally directed to a fully-depleted SOI device structure. In one illustrative embodiment, the device comprises first, second and third doped regions formed in the bulk substrate, wherein the dopant concentration level in the doped regions is greater than the dopant concentration in the bulk substrate. The first doped region is substantially aligned with the gate electrode of the device, while the second and third doped regions are vertically spaced apart from the first doped region.

36 Claims, 2 Drawing Sheets

FULLY-DEPLETED SOI DEVICE

CROSS-REFERENCE TO RELATED APPLICATION

This is a divisional of application Ser. No. 10/104,319 filed Mar. 21, 2002 now U.S. Pat. No. 6,780,686.

BACKGROUND OF THE INVENTION

1. Field of the Invention

This invention relates generally to semiconductor fabrication technology, and, more particularly, to doping methods for fully-depleted SOI structures, and a device comprising the resulting doped regions.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

As transistors are continually scaled in keeping with the requirements of advancing technology, device reliability dictates a concomitant reduction in the power supply voltage. Hence, every successive technology generation is often accompanied by a reduction in the operating voltage of the transistor. It is known that transistor devices fabricated on silicon-on-insulator (SOI) substrates exhibit better performance at low operating voltages than do transistors of similar dimensions fabricated in bulk silicon substrates. The superior performance of SOI devices at low operating voltage is related to the relatively lower junction capacitances obtained on an SOI device compared to a bulk silicon device of similar dimensions. The buried oxide layer in an SOI device separates active transistor regions from the bulk silicon substrate, thus reducing junction capacitance.

FIG. 1 depicts an example of a transistor 10 fabricated on an illustrative silicon-on-insulator substrate 11. As shown therein, the SOI substrate 11 is comprised of a bulk substrate 11A, a buried oxide layer 11B, and an active layer 11C. The transistor 10 is comprised of a gate insulation layer 14, a gate electrode 16, sidewall spacers 19, a drain region 18A, and a source region 18B. A plurality of trench isolation regions 17 are formed in the active layer 11C. Also depicted in FIG. 1 are a plurality of conductive contacts 20 formed in a layer of insulating material 21. The conductive contacts 20 provide electrical connection to the drain and source regions 18A, 18B. As constructed, the transistor 10 defines a channel region 12 in the active layer 11C beneath the gate insulating layer 14. The bulk substrate 11A is normally doped with an appropriate dopant material, i.e., a P-type dopant such as boron or boron difluoride for NMOS devices, or an N-type dopant such as arsenic or phosphorous for PMOS devices. Typically, the bulk substrate 11A will have a doping concentration level on the order of approximately $10^{15}$ ions/cm$^3$. The buried oxide layer 11B may be comprised of silicon dioxide, and it may have a thickness of approximately 200–360 nm (2000–3600 Å). The active layer 11C may be comprised of a doped silicon, and it may have a thickness of approximately 5–30 nm (50–300 Å).

Transistors fabricated in SOI substrates offer several performance advantages over transistors fabricated in bulk silicon substrates. For example, complementary-metal-oxide-semiconductor (CMOS) devices fabricated in SOI substrates are less prone to disabling capacitive coupling, known as latch-up. In addition, transistors fabricated in SOI substrates, in general, have large drive currents and high transconductance values. Also, the sub-micron SOI transistors have improved immunity to short-channel effects when compared with bulk transistors fabricated to similar dimensions.

Although SOI devices offer performance advantages over bulk silicon devices of similar dimensions, SOI devices share certain performance problems common to all thin-film transistors. For example, the active elements of an SOI transistor are fabricated in the thin-film active layer 11C. Scaling of thin-film transistors to smaller dimensions requires that the thickness of the active layer 11C be reduced. However, as the thickness of the active layer 11C is reduced, the electrical resistance of the active layer 11C correspondingly increases. This can have a negative impact on transistor performance because the fabrication of transistor elements in a conductive body having a high electrical resistance reduces the drive current of the transistor 10. Moreover, as the thickness of the active layer 11C of an SOI device continues to decrease, variations in the threshold voltage ($V_T$) of the device occur. In short, as the thickness of the active layer 11C decreases, the threshold voltage of the device becomes unstable. As a result, use of such unstable devices in modern integrated circuit devices, e.g., microprocessors, memory devices, logic devices, etc., becomes very difficult if not impossible.

Additionally, off-state leakage currents are always of concern in integrated circuit design, since such currents tend to, among other things, increase power consumption. Such increased power consumption is particularly undesirable in many modern consumer devices employing integrated circuits, e.g., portable computers. Lastly, as device dimensions continue to decrease in fully depleted SOI structures, increased short channel effects may occur. That is, in such fully depleted devices, at least some of the field lines of the electric field of the drain 18A tend to couple to the channel region 12 of the transistor 10 through the relatively thick (200–360 nm) buried oxide layer 11B. In some cases, the electric field of the drain 18A may act to, in effect, turn on the transistor 10. Theoretically, such problems may be reduced by reducing the thickness of the buried oxide layer 11B and/or increasing the doping concentration of the bulk substrate 11A. However, such actions, if taken, would tend to increase the junction capacitance between the drain and source regions 18A, 18B and the bulk substrate 11A, thereby negating one of the primary benefits of SOI technology, i.e., reducing such junction capacitance.

The present invention is directed to a device and various methods that may solve, or at least reduce, some or all of the aforementioned problems.

SUMMARY OF THE INVENTION

The present invention is generally directed to doping methods for fully-depleted SOI structures, and a device comprising such resulting doped regions. In one illustrative embodiment, the device comprises a transistor formed above a silicon-on-insulator substrate comprised of a bulk substrate, a buried oxide layer and an active layer, the transistor being comprised of a gate electrode, the bulk substrate being doped with a dopant material at a first concentration level. The device further comprises a first doped region formed in the bulk substrate, the first doped region being comprised of a dopant material that is the same type as the bulk substrate dopant material and having a greater concentration level of dopant material than the first concentration level of the bulk substrate, the first doped region being substantially aligned with the gate electrode.

In another illustrative embodiment, the device comprises a transistor formed above a silicon-on-insulator substrate comprised of a bulk substrate, a buried oxide layer and an active layer, the transistor being comprised of a gate electrode, the bulk substrate being doped with a dopant material at a first concentration level. The device further comprises first, second and third doped regions formed in the bulk substrate, the first, second and third regions being comprised of a dopant material that is the same type as the bulk substrate dopant material, the first, second and third regions having a greater concentration level of dopant material than the first concentration level of the bulk substrate, the first doped region being substantially aligned with the gate electrode and vertically spaced apart from the second and third doped regions.

In one illustrative embodiment, the method comprises forming a gate electrode above a silicon-on-insulator substrate comprised of a bulk substrate, a buried oxide layer and an active layer, the bulk substrate being doped with a dopant material at a first concentration level. The method further comprises performing an ion implant process using at least the gate electrode as a mask to implant a dopant material into the bulk substrate, the implant process being performed with a dopant material that is of the same type as the dopant material in the substrate, the implant process resulting in a first doped region formed in the bulk substrate that is substantially self-aligned with the gate electrode, the first doped region having a dopant concentration level that is greater than the first dopant concentration level of the bulk substrate.

In yet another illustrative embodiment, the method comprises forming a gate electrode above a silicon-on-insulator substrate comprised of a bulk substrate, a buried oxide layer and an active layer, the bulk substrate being doped with a dopant material at a first concentration level, and performing an ion implant process using at least the gate electrode as a mask to implant a dopant material into the bulk substrate, the implant process being performed with a dopant material that is of the same type as the dopant material in the bulk substrate, the implant process resulting in first, second and third doped regions formed in the bulk substrate, the first doped region being substantially self-aligned with the gate electrode and vertically spaced apart from said second and third doped regions, the first, second and third doped regions having a dopant concentration level that is greater than the first dopant concentration level of the bulk substrate.

BRIEF DESCRIPTION OF THE DRAWINGS

The invention may be understood by reference to the following description taken in conjunction with the accompanying drawings, in which like reference numerals identify like elements, and in which.

Figure 1:
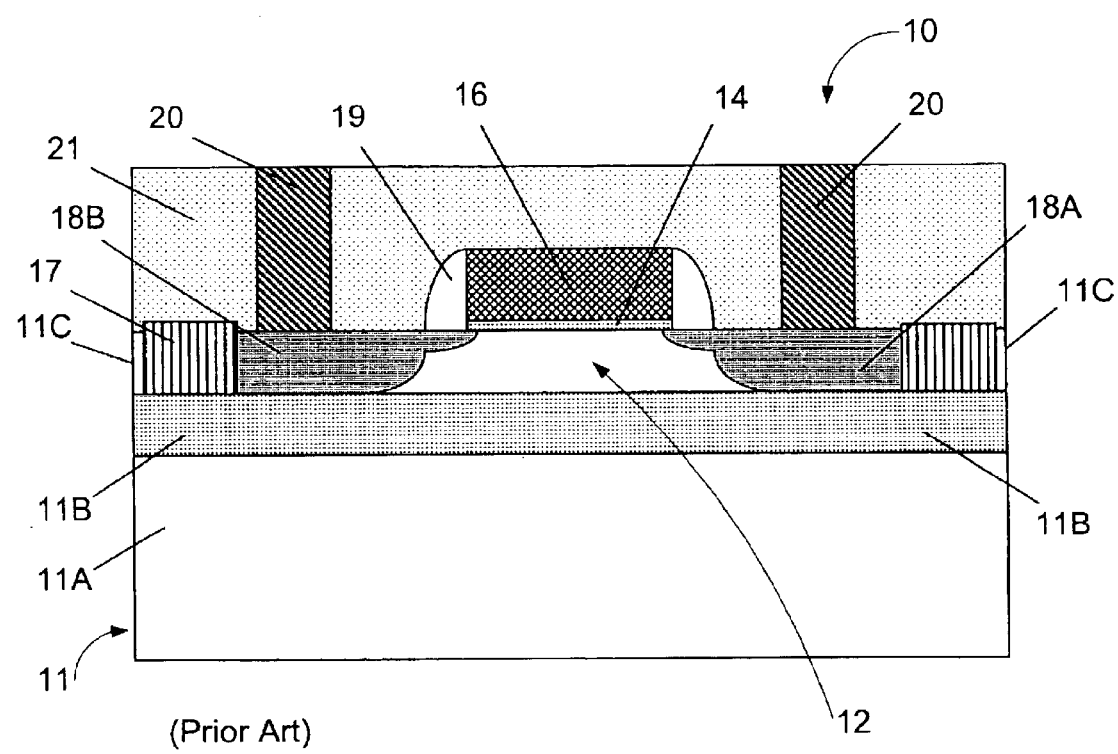
FIG. 1 is a cross-sectional view of an illustrative prior art semiconductor device formed above an SOI substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the under-standing of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to doping methods for fully-depleted SOI structures, and a device comprising the resulting doped regions. Although the present invention will be disclosed in the context of the formation of an illustrative NMOS transistor, those skilled in the art will understand after a complete reading of the present application that the present invention is not so limited. More particularly, the present invention may be employed with respect to a variety of technologies, e.g., NMOS, PMOS, CMOS, etc., and it may be employed with a variety of different type devices, e.g., memory devices, microprocessors, logic devices, etc.

Figure 2A:
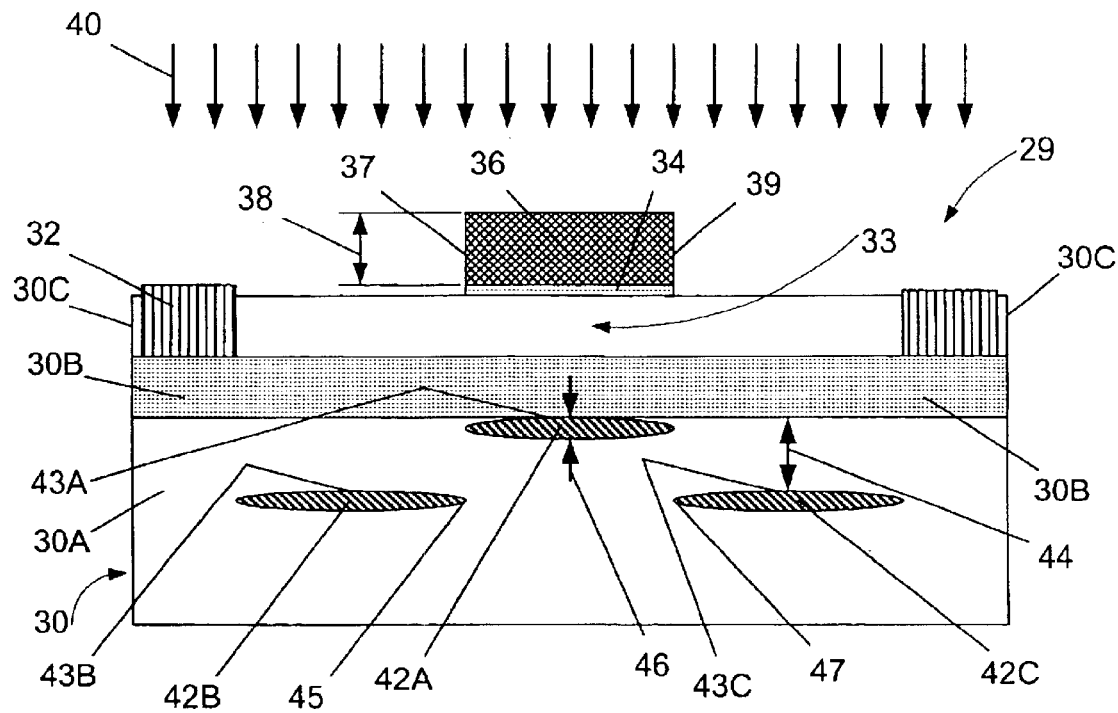
FIGS. 2A–2B are cross-sectional views depicting one illustrative method for forming portions of the semiconductor device of the present invention.

FIG. 2A depicts a partially formed transistor 29 at an intermediate stage of manufacture that is formed above an SOI substrate 30. In one illustrative embodiment, the SOI substrate 30 is comprised of a bulk substrate 30A, a buried oxide layer (BOX) 30B, and an active layer 30C. Of course, FIG. 2A only depicts a small portion of an entire substrate or wafer. In the illustrative embodiment where an NMOS device is formed, the bulk substrate 30A may be doped with a P-type dopant material, e.g., boron, boron difluoride, etc., and it may have a dopant concentration of approximately $10^{15}$ ions/cm$^3$. The buried oxide layer 30B may have a thickness that, in one embodiment, varies from approximately 5–50 nm (50–500 Å), and it may be comprised of silicon dioxide. The active layer 30C may have a thickness that varies from approximately 5–30 nm (50–300 Å), and, in the case of an NMOS device, it may be doped with a P-type dopant material. The recited details of the construction of the SOI substrate 30 should not be considered a limitation of the present invention unless such limitations are specifically set forth in the appended claims.

The semiconductor device 29 in FIG. 2A is depicted at a point during the manufacturing process wherein trench isolation regions 32 have been formed in the active layer 30C, and a gate insulating layer 34 and a gate electrode 36 have been formed above the active layer 30C. The gate electrode 36 has a thickness 38 that, in one embodiment, ranges from approximately 100–150 nm (1000–1500 Å). The semiconductor device 29 and its various components, e.g., gate electrode 36, gate insulation layer 34 and trench isolation regions 32 may all be formed using traditional techniques for forming such components. For example, the gate insulation layer 34 may be comprised of silicon dioxide and the gate electrode 36 may be comprised of a doped polysilicon. Thus, the particular techniques and materials used for forming the various components of the semiconductor device 29 depicted in FIG. 2A should not be considered a limitation of the present invention unless such limitations are clearly set forth in the appended claims.

Figure 2B:
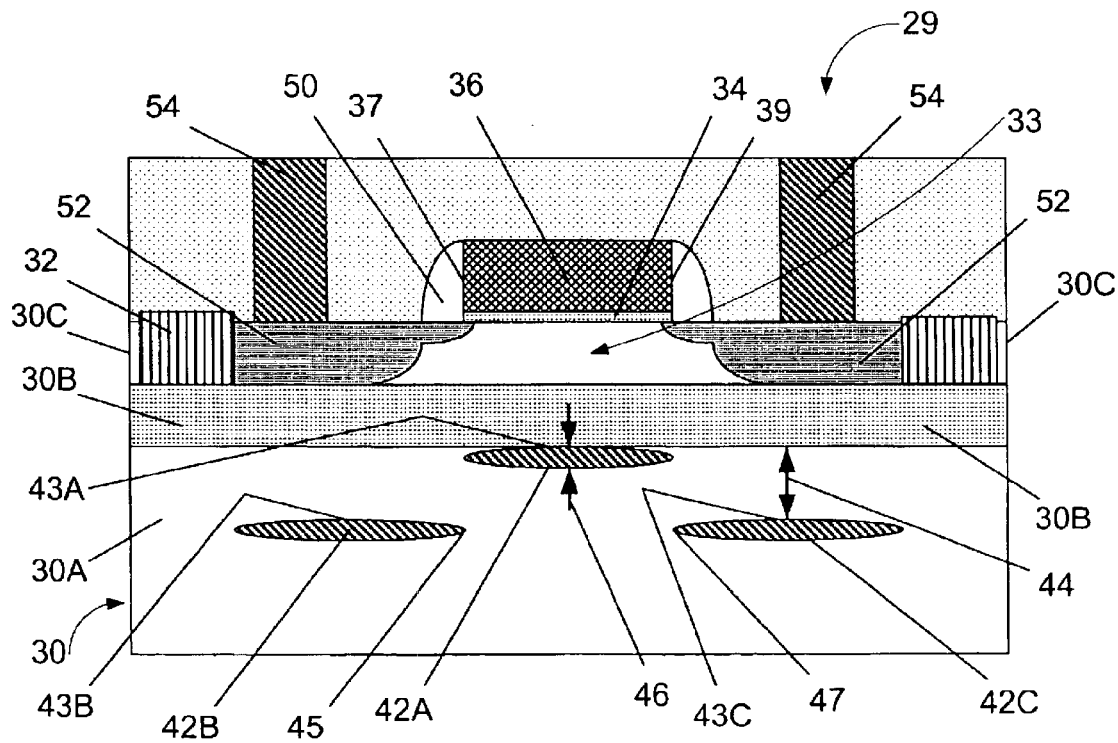

As indicated by the arrows 40 in FIG. 2A, an ion implant process is performed using the gate electrode 36 as an implant mask. The ion implant process 40 will be performed using a dopant material that is of the same type as the dopant material used to dope the bulk substrate 30A, i.e., a P-type dopant material for an NMOS device and an N-type dopant material for a PMOS device. The ion implant process 40 results in the formation of a plurality of doped regions in the bulk substrate 30A, i.e., a first doped region 42A, a second doped region 42B and a third doped region 42C, as indicated in FIG. 2B. Note that the first doped region 42A is substantially self-aligned with the gate electrode 36, and that the doped regions 42B, 42C are vertically offset from the first doped region 42A by a distance 44 that corresponds approximately to the thickness 38 of the gate electrode 36. That is, the upper surface 43A of the first doped region 42A is vertically spaced apart from the upper surfaces 43B, 43C of the second and third doped regions 42B, 42C, respectively, by a distance 44 that approximately equals the thickness 38 of the gate electrode 36. Moreover, using the present techniques, the first doped region 42A is positioned under what will become the channel region 33 of the transistor 29. Also note that the second and third doped regions 42B, 42C each have a respective edge 45, 47 that is approximately aligned with the sidewalls 37 of the gate electrode 36. Each of the doped regions 42A, 42B, 42C have a thickness 46 that, in one illustrative embodiment, is approximately 10–50 nm (100–500 Å). The energy of the implant process 40 is selected such that the upper surface 43A of the first doped region 42A is approximately aligned with the interface between the bulk substrate 30A and the buried oxide layer 30B. That is, the upper surface 43A of the first doped region 42A may be approximately 0–5 nm (0–50 Å) away from the interface between the bulk substrate 30A and the buried oxide layer 30B. In a preferred embodiment, the upper surface 43A will be located at the interface between the bulk substrate 30A and the buried oxide layer 30B.

In general, the ion implant process 40 will be performed at a very high dopant dose level such that the resulting doped regions, i.e., regions 42A, 42B, 42C, have a relatively high concentration of dopant material, i.e., on the order of at least $10^{16}$ ions/cm$^3$. That is, the dopant concentration of the doped regions 42A, 42B, 42C will be higher than the doping level in the bulk substrate 30A. In one illustrative embodiment, where boron is implanted during the implant process 40, the boron may be implanted at a dose of approximately $10^{14}$–$10^{16}$ ions/cm$^2$ at an energy level of 40–70 keV to result in the implant regions 42A, 42B, 42C having a dopant concentration level of approximately $10^{16}$–$10^{18}$ ions/cm$^3$. Other dopant species may be implanted at energy levels ranging from 40–400 keV depending on the particular dopant species used. After implantation, an anneal process may be performed at a temperature ranging from approximately 600–1050° C. In one embodiment, this anneal process may be performed at a relatively low temperature to ensure that the implant regions 42A, 42B, 42C remain substantially in the as implanted positions. Of course, for PMOS type devices, the ion implant process 40 would be performed with an N-type dopant material, e.g., arsenic or phosphorous. Moreover, for CMOS type technology, the various NMOS and PMOS devices can be appropriately masked on an as-needed basis while the implant process 40 is performed using appropriate dopant material on the appropriate NMOS or PMOS devices.

Thereafter, as shown in FIG. 2B, additional processing is performed to complete the formation of the transistor 29. More particularly, additional processes may be performed to form sidewall spacers 50, source/drain regions 52, conductive contacts 54, etc., as indicated in FIG. 2B. As before, the various components may be formed using a variety of standard techniques and materials well known to those skilled in the art. Thus, the particular techniques and materials used for forming the various components of the transistor 29 depicted in FIG. 2B should not be considered a limitation of the present invention unless such limitations are clearly set forth in the appended claims.

Through use of the present invention, various problems outlined in the background section of the application may be solved or reduced. More particularly, by creating the localized, self-aligned implant region 42A under the channel region 33 of the transistor 29, off-state leakage currents may be decreased. At the same time, the additional doped regions 42B, 42C formed using this self-aligned process are placed sufficiently deep in the bulk substrate 30A such that they will generally not tend to increase the junction capacitance between the bulk substrate 30A and the source/drain regions 52.

The present invention is generally directed to doping methods for fully-depleted SOI structures, and a device comprising the resulting doped regions. In one illustrative embodiment, the device comprises a transistor having a gate electrode formed above a silicon-on-insulator substrate comprised of a bulk substrate, a buried oxide layer and an active layer, wherein the bulk substrate is doped with a dopant material at a first concentration level. The device further comprises a first doped region 42A formed in the bulk substrate, the first doped region being comprised of a dopant material that is the same type as the bulk substrate dopant material, wherein the concentration level of dopant material in the first doped region is greater than the first concentration level of the bulk substrate. In this embodiment, the first doped region 42A is substantially aligned with the gate electrode.

In another illustrative embodiment, the device comprises a transistor formed above a silicon-on-insulator substrate comprised of a bulk substrate, a buried oxide layer and an active layer, the transistor being comprised of a gate electrode, the bulk substrate being doped With a dopant material at a first concentration level. The device further comprises first, second and third doped regions formed in the bulk substrate, the regions being comprised of a dopant material that is the same type as the bulk substrate dopant material, the first, second and third regions having a greater concentration level of dopant material than the first concentration level of the bulk substrate, the first doped region being substantially aligned with the gate electrode and vertically spaced apart from the second and third doped regions.

In one illustrative embodiment, the method comprises forming a gate electrode above a silicon-on-insulator substrate comprised of a bulk substrate, a buried oxide layer and an active layer, the bulk substrate being doped with a dopant material at a first concentration level, and performing an ion implant process using at least the gate electrode as a mask to implant a dopant material into the bulk substrate, the implant process being performed with a dopant material that is of the same type as the dopant material in the bulk substrate, the implant process resulting in a first doped region formed in the bulk substrate that is substantially self-aligned with the gate electrode, the first doped region having a dopant concentration level that is greater than the first concentration level of the bulk substrate.

In another illustrative embodiment, the method comprises forming a gate electrode above a silicon-on-insulator substrate comprised of a bulk substrate, a buried oxide layer and an active layer, the bulk substrate being doped with a dopant material at a first concentration level, and performing an ion implant process using at least the gate electrode as a mask to implant a dopant material into the bulk substrate, the implant process being performed with a dopant material that is of the same type as the dopant material in the bulk substrate, the implant process resulting in first, second and third doped regions formed in the bulk substrate, wherein the first doped region is substantially self-aligned with the gate electrode and vertically spaced apart from the second and third doped regions, the first, second and third doped regions having a dopant concentration level that is greater than the first dopant concentration level of the bulk substrate.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
   a transistor formed above a silicon-on-insulator substrate comprised of a bulk substrate, a buried oxide layer and an active layer, said transistor being comprised of a gate electrode, said bulk substrate being doped with a dopant material at a first concentration level; and
   first, second and third doped regions formed in said bulk substrate, said first, second and third doped regions being comprised of a dopant material that is the same type as said bulk substrate dopant material, said first, second and third doped regions having a greater concentration level of dopant material than said first concentration level, said first doped region being substantially aligned with said gate electrode and vertically spaced apart from said second and third doped regions.

2. The device of claim 1, wherein said transistor is comprised of at least one of an NMOS and PMOS device.

3. The device of claim 1, wherein said buried oxide layer is comprised of silicon dioxide and has a thickness ranging from approximately 5–50 nm.

4. The device of claim 1, wherein said active layer is comprised of silicon and has a thickness of approximately 5–30 nm.

5. The device of claim 1, wherein said gate electrode is comprised of polysilicon and has a thickness of approximately 100–150 nm.

6. The device of claim 1, wherein said gate electrode has a thickness and wherein said first doped region is vertically spaced apart from said second and third doped regions by a distance that corresponds approximately to said thickness of said gate electrode.

7. The device of claim 1, wherein said bulk substrate is doped with a P-type dopant material at a concentration level of approximately $10^{15}$ ions/cm$^3$ and said first, second and third doped regions are doped with a P-type dopant material at a dopant concentration level of at least approximately $10^{16}$ ions/cm$^3$.

8. The device of claim 1, wherein said bulk substrate is doped with an N-type dopant material at a concentration level of approximately $10^{15}$ ions/cm$^3$ and said first, second and third doped regions are doped with an N-type dopant material at a dopant concentration level of at least approximately $10^{16}$ ions/cm$^3$.

9. The device of claim 1, wherein said first, second and third doped regions each have a thickness of approximately 10–50 nm.

10. The device of claim 1, wherein each of said second and third doped regions has an inner edge that is approximately aligned with respect to said gate electrode.

11. The device of claim 1, wherein said first doped region has an upper surface that is positioned approximately 0–5 nm below an interface between said buried oxide layer and said bulk substrate.

12. The device of claim 1, wherein said second and third doped regions each have an upper surface that is positioned below an interface between the buried oxide layer and the bulk substrate by a distance that corresponds approximately to a thickness of the gate electrode.

13. The device of claim 1, further comprising a source region, a drain region, a sidewall spacer and a plurality of conductive interconnections.

14. A device, comprising:
   a transistor formed above a silicon-on-insulator substrate comprised of a bulk substrate, a buried oxide layer and an active layer, said transistor being comprised of a gate electrode having a thickness, said bulk substrate being doped with a dopant material at a first concentration level; and
   first, second and third doped regions formed in said bulk substrate, said first, second and third doped regions being comprised of a dopant material that is the same type as said bulk substrate dopant material, said first, second and third doped regions having a greater concentration level of dopant material than said first concentration level and at least a concentration level of approximately $10^{16}$ ions/cm$^3$, said first doped region being substantially aligned with said gate electrode and vertically spaced apart from said second and third doped regions by a distance that corresponds approximately to said thickness of said gate electrode.

15. The device of claim 14, wherein said transistor is comprised of at least one of an NMOS and PMOS device.

16. The device of claim 14, wherein said buried oxide layer is comprised of silicon dioxide and has a thickness ranging from approximately 5–50 nm.

17. The device of claim 14, wherein said active layer is comprised of silicon and has a thickness of approximately 5–30 nm.

18. The device of claim 14, wherein said gate electrode is comprised of polysilicon and has a thickness of approximately 100–150 nm.

19. The device of claim 14, wherein said bulk substrate is doped with a P-type dopant material at a concentration level of approximately $10^{15}$ ions/cm$^3$ and said first, second and third doped regions are doped with a P-type dopant material at a dopant concentration level of at least approximately $10^{16}$ ions/cm$^3$.

20. The device of claim 14, wherein said bulk substrate is doped with an N-type dopant material at a concentration level of approximately $10^{15}$ ions/cm$^3$ and said first, second and third doped regions are doped with an N-type dopant material at a dopant concentration level of at least approximately $10^{16}$ ions/cm$^3$.

21. The device of claim 14, wherein said first, second and third doped regions each have a thickness of approximately 10–50 nm.

22. The device of claim 14, wherein each of said second and third doped regions has an inner edge that is approximately aligned with respect to said gate electrode.

23. The device of claim 14, wherein said first doped region has an upper surface that is positioned approximately 0–5 nm below an interface between said buried oxide layer and said bulk substrate.

24. The device of claim 14, wherein said second and third doped regions each have an upper surface that is positioned below an interface between the buried oxide layer and the bulk substrate by a distance that corresponds approximately to the thickness of the gate electrode.

25. The device of claim 14, further comprising a source region, a drain region, a sidewall spacer and a plurality of conductive interconnections.

26. A device, comprising:
  a transistor formed above a silicon-on-insulator substrate comprised of a bulk substrate, a buried oxide layer and an active layer comprised of silicon, said transistor being comprised of a gate electrode having a thickness, said bulk substrate being doped with a dopant material at a first concentration level, said buried oxide layer being comprised of silicon dioxide; and first, second and third doped regions formed in said bulk substrate, said first, second and third doped regions being comprised of a dopant material that is the same type as said bulk substrate dopant material, said first, second and third doped regions having a thickness of approximately 10–50 nm and a greater concentration level of dopant material than said first concentration level and at least a concentration level of at least approximately $10^{16}$ ion/cm$^3$, said first doped region being substantially aligned with said gate electrode and vertically spaced apart from said second and third doped regions by a distance that corresponds approximately to said thickness of said gate electrode.

27. The device of claim 26, wherein said transistor is comprised of at least one of an NMOS and PMOS device.

28. The device of claim 26, wherein said buried oxide layer has a thickness ranging from approximately 5–50 nm.

29. The device of claim 26, wherein said active layer has a thickness of approximately 5–30 nm.

30. The device of claim 26, wherein said gate electrode is comprised of polysilicon and has a thickness of approximately 100–150 nm.

31. The device of claim 26, wherein said bulk substrate is doped with a P-type dopant material at a concentration level of approximately $10^{15}$ ions/cm$^3$ and said first, second and third doped regions are doped with a P-type dopant material at a dopant concentration level of at least approximately $10^{16}$ ions/cm$^3$.

32. The device of claim 26, wherein said bulk substrate is doped with an N-type dopant material at a concentration level of approximately $10^{15}$ ions/cm$^3$ and said first, second and third doped regions are doped with an N-type dopant material at a dopant concentration level of at least approximately $10^{16}$ ions/cm$^3$.

33. The device of claim 26, wherein each of said second and third doped regions has an inner edge that is approximately aligned with respect to said gate electrode.

34. The device of claim 26, wherein said first doped region has an upper surface that is positioned approximately 0–5 nm below an interface between said buried oxide layer and said bulk substrate.

35. The device of claim 26, wherein said second and third doped regions each have an upper surface that is positioned below an interface between the buried oxide layer and the bulk substrate by a distance that corresponds approximately to the thickness of the gate electrode.

36. The device of claim 26, further comprising a source region, a drain region, a sidewall spacer and a plurality of conductive interconnections.

* * * * *